(12) United States Patent
Zettler et al.

(10) Patent No.: US 10,228,403 B2
(45) Date of Patent: Mar. 12, 2019

(54) SENSOR DEVICE, EVALUATION DEVICE AND CORRESPONDING SYSTEMS AND METHODS

(71) Applicant: Infineon Technologies AG, Neubiberg (DE)

(72) Inventors: Thomas Zettler, Hoehenkirchen-Siegertsbrunn (DE); Dirk Hammerschmidt, Villach (AT); Friedrich Rasbornig, Klagenfurt (AT); Wolfgang Scheibenzuber, Munich (DE); Wolfgang Scherr, Villach Landskron (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/218,606

(22) Filed: Jul. 25, 2016

(65) Prior Publication Data

US 2017/0023630 A1  Jan. 26, 2017

(30) Foreign Application Priority Data

Jul. 24, 2015 (DE) .......................... 10 2015 112 105

(51) Int. Cl.
*G01R 29/26* (2006.01)
*G01R 31/28* (2006.01)
(Continued)

(52) U.S. Cl.
CPC ......... *G01R 29/26* (2013.01); *G01R 31/2829* (2013.01); *G01R 29/0814* (2013.01);
(Continued)

(58) Field of Classification Search
CPC .... G01R 29/26; G01R 31/001; G01R 31/281; G01R 31/002
(Continued)

(56) References Cited

U.S. PATENT DOCUMENTS 3,102,231 A * 8/1963 Wolf .................. G01R 31/2836
                                                            324/520
3,639,703 A * 2/1972 Bergemann ............ G01R 29/26
                                                            324/613
(Continued)

FOREIGN PATENT DOCUMENTS

CN          1595180 A       3/2005
CN        101069093 A      11/2007
(Continued)

OTHER PUBLICATIONS

Kish, L. B., R. Vajtai, and C. G. Granqvist. "Extracting information from noise spectra of chemical sensors: single sensor electronic noses and tongues." Sensors and Actuators B: Chemical 71.1-2 (2000): 55-59.*

*Primary Examiner* — Christopher P McAndrew
(74) *Attorney, Agent, or Firm* — Design IP

(57) ABSTRACT

Various devices, systems and methods are disclosed where a noise signal component of a sensor signal is used to obtain information about a sensor device. A device may include an evaluation circuit that is configured to receive a sensor signal having a noise signal component, and the evaluation circuit is further configured to evaluate the noise signal component to obtain information about a sensor device generating the sensor signal.

28 Claims, 8 Drawing Sheets

(51) Int. Cl.
*G01R 29/08* (2006.01)
*G01R 31/00* (2006.01)

(52) U.S. Cl.
CPC .......... *G01R 31/001* (2013.01); *G01R 31/002* (2013.01); *G01R 31/281* (2013.01)

(58) Field of Classification Search
USPC ........................................................ 324/613
See application file for complete search history.

(56) References Cited

U.S. PATENT DOCUMENTS

| | | | | |
|---|---|---|---|---|
| 3,652,931 | A * | 3/1972 | Josenhans | G01R 29/26 324/613 |
| 4,989,165 | A | 1/1991 | Watanabe | |
| 5,180,985 | A * | 1/1993 | Zoccarato | G01R 29/26 324/613 |
| 5,804,975 | A * | 9/1998 | Alers | G01R 31/2626 324/520 |
| 6,057,690 | A * | 5/2000 | Buckley | G01R 29/26 324/613 |
| 6,268,735 | B1 * | 7/2001 | Craig | G01R 23/20 324/601 |
| 6,600,327 | B1 * | 7/2003 | Anderskouv | H03K 17/082 324/528 |
| 6,856,252 | B2 | 2/2005 | Pfefferseder et al. | |
| 7,940,838 | B1 * | 5/2011 | Matis | H04L 25/03006 324/613 |
| 7,944,216 | B2 | 5/2011 | Brasseur et al. | |
| 8,766,647 | B2 * | 7/2014 | Leibowitz | G06F 1/26 324/600 |
| 8,860,432 | B2 * | 10/2014 | Shen | G06F 3/044 324/613 |
| 8,866,493 | B2 * | 10/2014 | Kremin | G06F 3/0412 324/613 |
| 8,942,949 | B2 | 1/2015 | Hammerschmidt | |
| 2001/0013775 | A1 | 8/2001 | Blossfeld | |
| 2005/0246142 | A1 | 11/2005 | Hammerschmidt | |
| 2010/0283481 | A1 * | 11/2010 | Lemmon | H01Q 17/00 324/613 |
| 2011/0270553 | A1 | 11/2011 | Ausserlechner et al. | |
| 2012/0049869 | A1 * | 3/2012 | Kremin | G06F 3/0412 324/679 |
| 2014/0118006 | A1 * | 5/2014 | Chuang | G01R 29/26 324/614 |
| 2014/0247059 | A1 * | 9/2014 | Lam | G01R 29/26 324/613 |
| 2014/0368217 | A1 * | 12/2014 | Torigoe | G06F 17/5036 324/613 |
| 2015/0008940 | A1 * | 1/2015 | George | G01R 31/31727 324/613 |

FOREIGN PATENT DOCUMENTS

| | | |
|---|---|---|
| CN | 102095560 A | 6/2011 |
| DE | 102004010665 A1 | 9/2005 |
| DE | 102007058707 A1 | 6/2009 |
| EP | 1006351 B1 | 10/2003 |
| EP | 1366477 B1 | 6/2005 |
| WO | 2002069297 A1 | 9/2002 |

\* cited by examiner

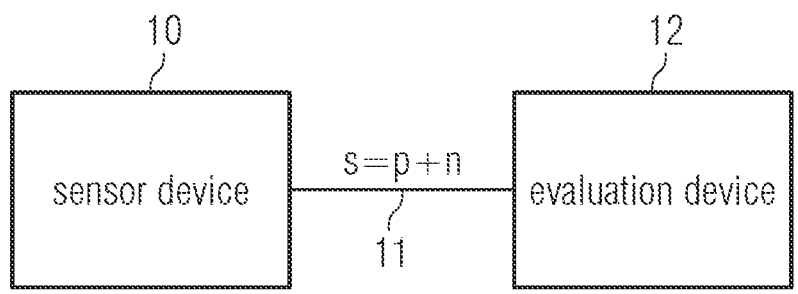
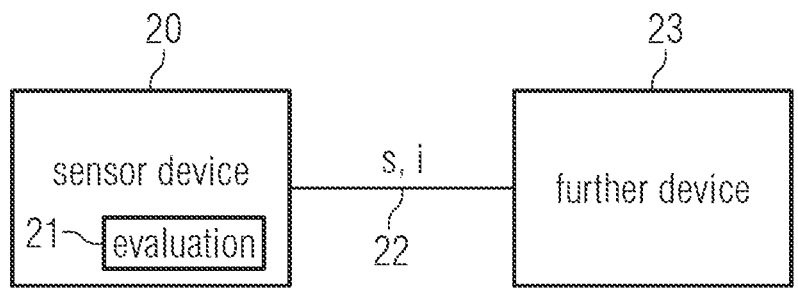
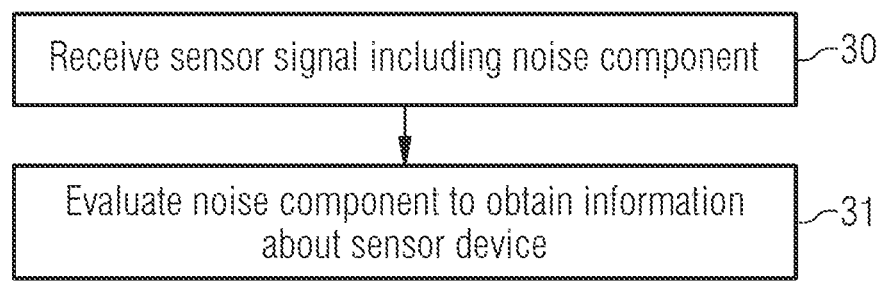

SENSOR DEVICE, EVALUATION DEVICE AND CORRESPONDING SYSTEMS AND METHODS

FIELD

The present application relates to sensor devices, evaluation devices for sensor devices, systems comprising such sensor devices and/or evaluation devices and to corresponding methods.

BACKGROUND

Sensors are commonly used to capture some physical quantity, like temperature, magnetic field, electric current, electric voltage, pressure, etc., and to output an electric signal (e.g., voltage signal or current signal) corresponding to the captured physical quantity. Besides the actual sensor, sensor devices may comprise additional components like amplifiers, voltage references or analog-to-digital converters (ADCs) to process the signals generated by the actual sensors. Such sensor devices may, for example, be integrated on a single chip.

Sensor devices may be used in safety-critical applications, for example in the automotive environment. For example, in the automotive field airbag deployment or antilock braking systems (ABS) may operate based on signals received from sensor devices. For such safety-critical applications, various requirements exist for sensor devices and systems using such sensor devices. For example, in the automotive field International Organization for Standardization (ISO) 26262 defines functional safety requirements for road vehicles.

One requirement which may often exist in such safety-critical applications is that malfunctions of the sensor device have to be detectable by the system, for example by an entity receiving signals from the sensor device. In other words, according to such a requirement it has to be possible to detect, if a sensor device delivers erroneous values, e.g. due to a fault of the sensor device. One approach to ensure this is to provide redundancy, for example to provide two separate sensors for measuring the same physical quantity. Deviations between measurements of the two sensor devices above a threshold may indicate a malfunction of at least one of the two sensors provided. However, providing such redundancy requires additional chip space.

As a related problem, as manufacturers need to guarantee adherence to safety requirements, manufacturers may want to ensure that only components approved by them are used, for example in the case of a replacement of components like sensor devices. In this case, it may for example be desirable to be able to detect whether a replacement component from the original manufacturer or a different replacement component is used.

Therefore, a general need exists to be able to obtain information about a sensor device, for example regarding possible malfunction of the sensor device or regarding authenticity of the sensor device, in an efficient manner.

SUMMARY

In embodiments, sensor devices, evaluation devices for sensor devices, systems comprising such sensor devices and/or evaluation devices and corresponding methods are provided.

In an embodiment, a device includes an evaluation circuit that is configured to receive a sensor signal having a noise signal component. The evaluation circuit is further configured to evaluate the noise signal component to obtain information about a sensor device generating the sensor signal.

In another embodiment, a system includes a sensor device, an evaluation device configure to receive a sensor signal from the sensor device, and a connection between the sensor device and the evaluation device.

In another embodiment, a system includes a sensor device; and an evaluation circuit connected to the sensor device, wherein the evaluation circuit is configured to receive a sensor signal comprising a noise signal component, and the evaluation circuit is further configured to evaluate the noise signal component to obtain information about a sensor device generating the sensor signal.

In another embodiment, a sensor device includes a sensor and at least one further component, the at least one further component being configured to add noise to the sensor signal without other processing of the sensor signal.

In another embodiment, a method includes receiving a sensor signal including a noise signal component, and analyzing the noise signal component to obtain information about a sensor device generating the sensor signal.

BRIEF DESCRIPTION OF THE DRAWINGS

FIG. 1 is a schematic view of a system according to an embodiment.

FIG. 2 is a schematic view of a system according to a further embodiment.

FIG. 3 is a flowchart illustrating a method according to an embodiment.

DETAILED DESCRIPTION

Figure 4:
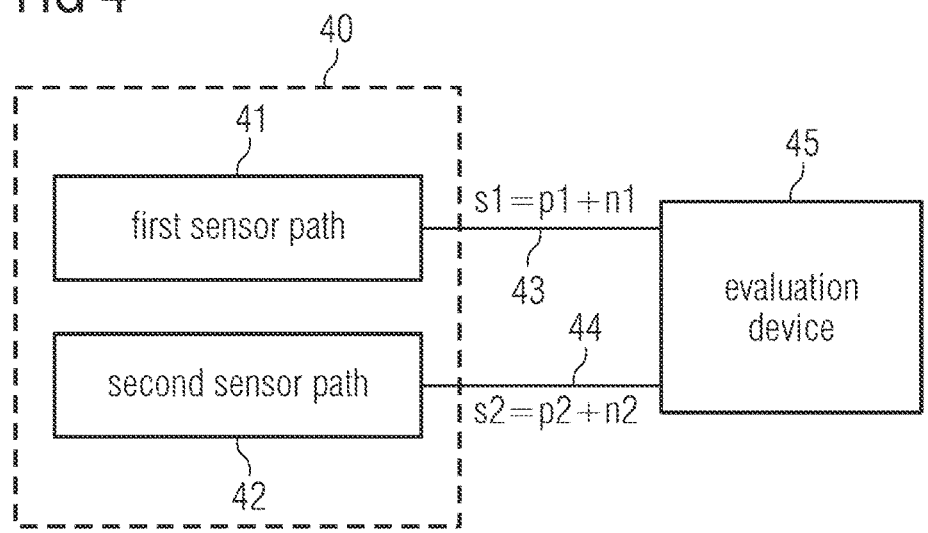
FIG. 4 is a schematic diagram of a system according to a further embodiment.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments. Variations or modifications described with respect to one of the embodiments may also be applicable to other embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to sensors and sensor systems and to obtaining information about sensors and sensor systems. A sensor, as already mentioned in the background section, may refer to a component which converts a physical quantity to be measured to an electric signal, for example a current signal or a voltage signal. The physical quantity may for example comprise a magnetic field, an electric field, a pressure, a force, a current or a voltage, but is not limited thereto.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

A system as used herein comprises a sensor device and at least one further device to which the sensor device sends signals corresponding to the measured quantity. For example, such a further device may comprise an electronic control unit (ECU), for example an electronic control unit of an automobile.

Terminology used herein may correspond to terminology as used in the international standard ISO 26262 related to functional safety for road vehicles. For example, the term "error" may refer to any discrepancy between a computed, observed or measured value or condition and the true, specified or theoretically correct value or condition. A fault may refer to an abnormal condition that can cause an element or an item like a sensor to fail. A failure may refer to a termination of the ability of an element to perform a function as required.

The term "malfunction" as used herein may for example refer to an error, fault or failure in the above sense.

A safe state may refer to an operating mode of an item without an unreasonable level of risk. Examples may include a normal operating mode, a degraded operating mode or a switched-off mode. It may be required that upon detection of a malfunction (for example a fault) an entity (for example item, system etc.) transitions to a safe state within a fault-tolerant time interval. Such a transition in some embodiments may be performed in response to a noise signal component generated by a sensor device indicating a possible malfunction. Noise, as used herein, may be a statistical quantity according to a certain distribution where individual noise events are being essentially random according to the distribution In embodiments, noise of a signal generated by a sensor device is evaluated to obtain information about, related to and/or corresponding to the sensor device. Such information may for example relate to malfunctions of the sensor device or may relate to authenticity of the sensor device, for example to discern sensor devices of one manufacturer from sensor devices of other manufacturers. Embodiments use the fact that various components of a sensor device generate specific noise, and a deviation from a typical noise pattern may indicate a malfunction or a different type of sensor device being used, for example a sensor device from another manufacturer.

Such a noise evaluation may be performed by an external evaluation device which receives signals from the sensor device. In some embodiments, such an evaluation device may also serve other purposes within a system. For example, the evaluation device may be implemented by an ECU. In other embodiments, such noise evaluation may be performed within the sensor device, and the sensor device may then transmit corresponding information obtained based on the noise to one or more further devices.

Turning now to the figures, FIG. 1 illustrates a system according to an embodiment. The system of FIG. 1 comprises a sensor device 10 and an evaluation device 12. Sensor device 10 in some embodiments may be integrated on a single chip die. However, in other embodiments, also a plurality of chips and/or external components may be used for implementing sensor device 10. Sensor device 10 may measure any physical quantity, as mentioned above, and transmit a signal s to evaluation device 12 via a communication connection 11. Communication connection 11 may be a wire-based connection or a wireless connection. The signal s in the example shown comprises a wanted signal component p which represents the physical quantity measured by sensor device 10, and a noise component n. In embodiments, evaluation device 12 may analyze the noise component n to obtain information about sensor device 10. For example, by analyzing noise component n, evaluation device 12 may obtain information regarding a possible malfunction of sensor device 10 and/or information about a type of sensor device 10. As an example for the latter, evaluation device 12, by analyzing noise component n, may distinguish sensor device 10 of a specific manufacturer from sensor devices of other manufacturers.

With many sensor devices, wanted signal p may be a band-limited signal, which may for example be filtered out of internal signals of sensor device 10 having a higher data rate. Such a band limitation may be necessary if wide band noise that is added by various sources within sensor device 10 has to be removed in order to fulfill accuracy requirements of the measurement represented by the wanted signal component p. In such a case, noise component n may be analyzed in a frequency range above (e.g., outside of or substantially outside of) the band-limited frequency range used by wanted signal p. In this higher frequency range, noise signal component n is therefore essentially undisturbed by wanted signal component p.

As will be explained later, various components of sensor device 10 may contribute to the noise signal component n. In some embodiments, by analyzing noise signal component n, information about which component of sensor device 10 may be malfunctioning and/or information regarding a type of malfunction may be obtained by evaluation device 12.

As mentioned above, noise component n may be analyzed in a higher frequency range than a frequency range used by wanted signal component p. In some embodiments, connection 11 may be a wire-based connection suitable for such higher frequency ranges, for example a coaxial cable or otherwise shielded cable. Other suitable connections include Ethernet connections, for example Ethernet TIA Cat 5, 6 or 7 connections, or so-called microstrip lines. Additional shieldings may be used together with such connections in some embodiments. With such connections, high-frequent noise components may be transmitted to evaluation device 12.

In the embodiment of FIG. 1, the noise signal component n of sensor device 10 is evaluated by an external device, in this case evaluation device 12. Evaluation device 12 may also be used to process the wanted signal component p in any desired conventional manner. In some embodiments, evaluation device 12 may be an electronic control unit (ECU), for example an electronic control unit in an automotive system.

In other embodiments, the evaluation of the noise component may be performed within the sensor device. A corresponding embodiment is illustrated in FIG. 2.

A sensor device 20 in the embodiment of FIG. 2 comprises an evaluation component 21, which may perform essentially the same function as described with reference to FIG. 1 for evaluation device 12. Sensor device 20 may then transmit a sensor signal s based on the measured quantity and an information signal i via one or more communication connections 22. For example, in some embodiments signals s and i may be transmitted via a single communication connection 22 (for example by using different frequency ranges or different time slots for the two signals s and i, or by transmitting s and i as in-phase and quadrature components of a signal, just to give some examples), or separate communication connections may be provided. Signals s and i in the illustration of FIG. 2 are transmitted to a further device 23, for example an ECU.

Information signal i may comprise information obtained based on a noise component of an internal signal of sensor device 20 and may for example indicate a malfunction of sensor device 20 and/or may indicate a type of sensor device 20. Type of sensor device may refer to an information whether sensor device 20 is a sensor device provided by a particular manufacturer.

FIG. 3 is a flowchart illustrating a method according to an embodiment. The method of FIG. 3 may be implemented in the systems of FIG. 1 or 2, for example in evaluation device 12 of FIG. 1 or evaluation component 21 of FIG. 2, but is not limited thereto.

At 30, the method comprises receiving a sensor signal including a noise component. The receiving may be at an evaluation device as illustrated in FIG. 1, or at an internal evaluation component as shown in FIG. 2, but is not limited thereto.

At 31, the method comprises evaluating the noise component of the signal to obtain information about the sensor device generating the sensor signal. The information may comprise information regarding a malfunction of the sensor device or information regarding a type of the sensor device.

In some embodiments, evaluating the noise component may comprise evaluating the noise component in different frequency ranges. In some embodiments, for example a ratio of noise components in different frequency ranges may be compared to a threshold. In other embodiments, the information may comprise information about a component of the sensor device which may malfunction. In other words, in embodiments the noise component may be evaluated to discern between malfunctions of different components and/or different types of malfunctions.

In some embodiments, the noise component (possibly within a certain frequency range) may be compared to one or more threshold values. In some embodiments, the threshold values may be dependent on environmental parameters like a temperature. In some embodiments, the sensor device may comprise dedicated noise sources used for monitoring the sensor device.

The above-mentioned possibilities for evaluating the noise component will be discussed below in some more detail.

In yet other embodiments, two different sensor paths with different noise behavior may be provided. In some embodiments, evaluating the noise component may comprise evaluating a noise ratio of two different sensor paths. An example embodiment comprising two different sensor paths is illustrated in FIG. 4.

In FIG. 4 a system comprising a first sensor path 41 and a second sensor path 42 are provided. First sensor path 41 and second sensor path 42 may have elements distinctive from each other, for example different types of sensors, different ADCs, etc. However, in other embodiments first sensor path 41 and second sensor path 42 also may share one or more elements. For example, while first and second sensor path may comprise different sensors, they may use a common analog-to-digital converter. In some embodiments, first sensor path 41 and second sensor path 42 are integrated in a common sensor device 40. In other embodiments, first sensor path 41 and second sensor path 42 may be provided in physically separate sensor devices. In some embodiments, first sensor path 41 and second sensor path 42 may measure the same physical quantity. Sensor path 41 provides a first signal s1 which comprises a first wanted signal component p1 and a first noise component n1. In the system of FIG. 4, first signal component s1 is transmitted to an evaluation device 45 via a communication connection 43. Furthermore, second sensor path 42 provides a second signal s2 comprising a second wanted signal component p2 and a second noise component n2. In the system of FIG. 4, signal s2 is transmitted to evaluation device 45 using a second communication connection 44. In other embodiments, instead of providing two communication connections 43, 44, signals s1, s2 may be transmitted via a single communication connection using for example any conventional multiplexing technique.

In embodiments, first sensor path 41 and second sensor path 42 may be designed such that the first noise component n1 differs from the second noise component n2. As will be explained later, this may for example be achieved by using at least in part different components in first sensor path 41 and second sensor path 42, as different components (for example different kinds of analog-to-digital converters) tend to have different noise characteristics. Evaluation device 45 may then evaluate the noise components n1, n2 to detect possible malfunctions or obtain other information about the first and second sensor paths 41, 42. This evaluation for each component n1, n2 may be performed as already explained with reference to FIGS. 1 to 3. In addition, a ratio between components n1 and n2 or parts thereof (for example, a ratio between noise magnitudes in certain frequency ranges of n1, n2) may be monitored by evaluation device 45 to obtain information about the first and second sensor paths 41, 42.

Figure 5:
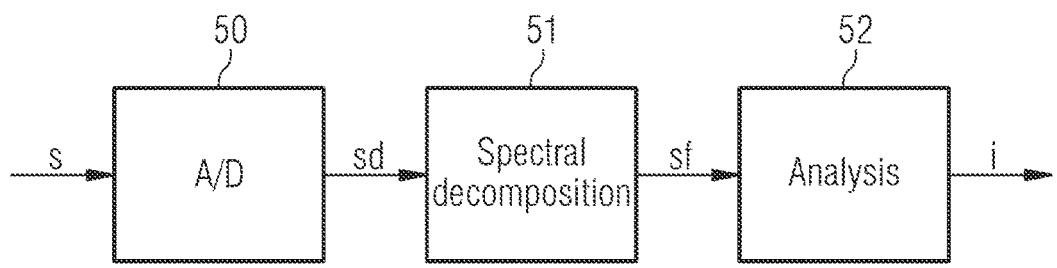
FIG. 5 is a diagram illustrating part of an evaluation device according to an embodiment.

As already mentioned, in embodiments different frequency components of a noise component of a sensor signal may be evaluated. FIG. 5 illustrates a possible signal path, which may be implemented in an evaluation device or in a sensor device as mentioned previously. In some embodiments, also part of the signal path may be implemented in a sensor device, whereas another part of the signal path may be implemented in the evaluation device.

In the example of FIG. 5, a sensor signal s comprising a noise component is digitized by an analog-to-digital converter 50. In some embodiments, analog-to-digital converter 50 may be part of the sensor device and may add to the noise characteristic of the sensor device, as will be explained later. The digitized sensor signal is labeled sd in FIG. 5 and is subjected to a discrete spectral decomposition element 51, for example a discrete Fourier transformation, conveniently implemented as a fast Fourier transform, to convert signal sd into a signal sf in the frequency domain. In other embodiments, spectral decomposition element 51 may for example comprise analog and/or digital filters to provide a spectral decomposition. Details of how to realize the discrete spectral decomposition element 51 are known to a person of ordinary skill in the art and therefore not explained in detail here.

An analysis circuit 52 may then analyses signal sf, for example analyzes different frequency components of signal sf, and outputs an information signal i. The information signal i may comprise information on spectral or frequency components of the frequency domain signal sf.

In some embodiments the spectral decomposition of the frequency domain signal sf may contain information on the signal path upstream the discrete information signal element 51, optionally even upstream and up to the discrete decomposition element 51.

In other words characteristics of the sensor element (not shown) providing signal s may have an impact on the frequency domain signal sf. Alternatively, or additionally analog-to-digital converter 50 may have an effect on the frequency domain signal sf. Under the same token any processing element within the signal path, such as a filter, an amplifier, a delay element, etc may have an impact on the frequency domain signal sf.

Any such impacts or changes in the frequency domain signal sf may be useful to identify some sort of deviation from normal behavior for one or all of those elements. Characteristics of the frequency domain signal sf may be reflected by the information signal i.

In some implementations the information signal i may comprise information regarding the sensor device (for example information regarding a possible malfunction or information regarding authenticity as explained above). Components 51, 52 may for example be implemented in an evaluation device like evaluation device 12 or 45 above or in an evaluation component 21. As components 51 and 52 process a digital signal, they may for example also be implemented at least in part by software by programming a processor accordingly, but they may also be implemented using hardware components, for example logic components. In some embodiments, for example a digital signal processor may be used to implement the discrete Fourier transform and the analysis.

In other embodiments, instead of a discrete Fourier transform, filters, for example bandpass filters, may be used to filter out frequency components of signal s to be analyzed, in particular signal components with little or no wanted signal component therein.

In the following, more detailed embodiments will be discussed to illustrate the concepts set forth above further.

Figure 6:
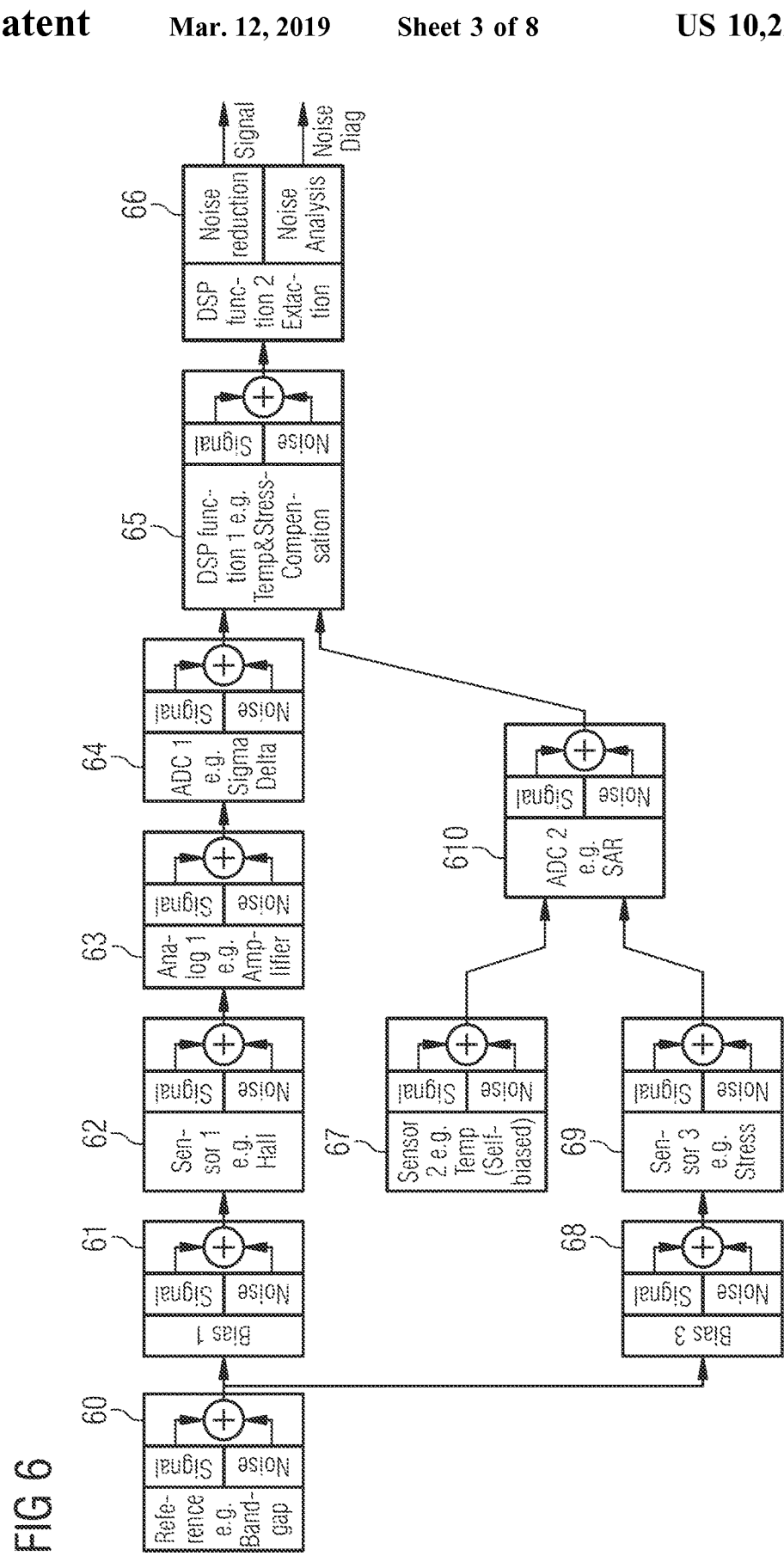
FIG. 6 is a more detailed block diagram illustrating a device or system according to an embodiment.

FIG. 6 illustrates an embodiment of a sensor device or system according to an embodiment. The embodiment of FIG. 6 comprises various blocks 60 to 610 representing various components of the device or system. In some embodiments, all the illustrated blocks may be provided in an integrated sensor device, in which case FIG. 6 illustrates a sensor device. In other embodiments, some of the components, for example a block 66 to be discussed later, may be provided in an external evaluation device (for example as illustrated in FIG. 1), in which case FIG. 6 may illustrate a system comprising a sensor device and an evaluation device.

The embodiment of FIG. 6 comprises a first sensor 62, for example a Hall sensor, to measure a magnetic field, a second sensor 67, for example a temperature sensor, and a third sensor 69, for example a stress sensor, i.e. a sensor for measuring a mechanical stress. These types of sensors serve merely as examples, and other types of sensors may be provided. It is to be understood that the types of sensors 62, 67, 69 may measure an identical physical quantity, say the magnetic field strength. Alternatively the types of sensors 62, 67, 69 may measure different physical quantities, such as sensor 67 temprature, sensor 69 mechanical stress, and sensor 62 magnetic field strength. As a further alternative some of the types of sensor may measure the same physical quantity, e.g. sensors 62 and 67 the magnetic field, while the further sensor element 69 measures a different quantity, e.g. stress or temperature. It is to be understood that other configurations are conceivable and contemplated for the present disclosure.

Each of sensors 62, 67 and 69 may generate a wanted signal component, to which a specific noise signal component is added, as illustrated by adders in FIG. 6. Such addition of noise signal components is usually inherent to sensors. Without limitation a specific noise component may deliberately be added. It is conceivable that the deliberately added noise component dominates the intrinsic noise component.

First sensor 62 may be biased by a first bias voltage generated by a first biasing block 61 (for example a DC-DC converter or a stabilized voltage source). Likewise, in the embodiment of FIG. 6 third sensor 69 is biased by a biasing block 68, for example a DC-DC converter or a stabilized voltage source, while second sensor 67 is biased internally. Biasing blocks 61, 68 generate their bias voltages based on a reference voltage provided by a reference voltage component 60, for example a band gap circuit. Each of components 60, 61 and 68 also generates a wanted signal component (for example biasing voltage and reference voltage) which may comprise some noise signal component. Noise from the reference component 60 also causes noise signal components in the signals of biasing components 61, 68, which in turn cause noise in the sensor signals output by sensors 62, 69. In other words, noise signal components basically propagate in the circuit. Depending on implementations the noise signal components may be altered as they propagate within a circuit as described.

The signal from the first sensor 62 is fed to an analog block 63, which may for example comprise an amplifier and/or an analog filter. Also in analog block 63, characteristic noise is added to the signal. The signal output by analog block 63 is provided to a first analog-to-digital converter 64, which in the example shown may be a sigma-delta analog-to-digital converter or any other suitable analog-to-digital converter. Also in this analog-to-digital conversion, noise (e.g. quantization noise) is added to the output signal.

Furthermore, the signals from second sensor 67 and third sensor 69 are provided to a second analog-to-digital converter 610, which in the example shown may be a successive approximation register (SAR) converter. Also in the conversion by converter 610, specific noise is added. In particular the noise components added by the first AD converter 64 may be different to the specific noise components added by the converter 610.

The outputs of first and second analog-to-digital converter 64, 610 are provided to a first digital signal processing block 65, which may be implemented in a first digital signal processor. In block 65, for example temperature and stress compensation of the signal provided by first analog-to-digital converter 64 may be performed based on the signal provided by second analog-to-digital converter 610. For example, lookup tables or other calibration curves may be used to correct the signal output by first analog-to-digital converter 64 based on measurements from second and third sensors 67, 69. The signal output by first analog-to-digital converter 64 represents the signal measured by first sensor 62 (including the noise added by sensor 62) as well as noise components added by components 60, 61 and 63 in digital form, except components that are lost due to the digitization (for example, white noise is only included up to the Nyquist frequency). In addition, the signal output by first analog-to-digital converter 64 includes noise like quantization noise added due to the conversion in first analog-to-digital converter 64. This noise added by first analog-to-digital converter 64 may be characteristic for the type of analog-to-digital conversion used by first analog-to-digital converter 64.

Temperature and stress compensation in block 65 or any other function may add further noise. The output signal of block 65 is provided to a second digital signal processing block 66. Second digital signal processing block 66 may be implemented in the same digital signal processor as block 65 or may e.g. be implemented using a second digital signal processor or e.g. any other processor, circuit or logic. In the example of FIG. 6, block 66 performs a noise reduction on the signal using any conventional noise reduction techniques, for example using filtering. Furthermore, block 66 performs a noise analysis to obtain information about components in the signal path generating the signal provided to block 66, for example about the sensor device including blocks 60 to 65, 67 to 610 in the example of FIG. 6. The information may for example include information regarding possible malfunctions or authenticity information. The information in some embodiments may also indicate which component or block may have a malfunction. Examples how based on noise information specific to various blocks or components in a signal path may be obtained will be discussed later with reference to FIG. 8.

It should be noted that FIG. 6 is merely an example of a sensor device or system, using for example a Hall sensor as primary sensor. FIG. 6 in particular gives an example how signal processing blocks of such a sensor device may process the data of the first sensor 62 and may combine it with further measurements (for example temperature and stress measurements) in order to remove for example parasitic influences. For example, nonlinearities of the measurement by first sensor 62 due to temperature effects and/or influences of mechanical stress on first sensor 62 or other blocks (e.g. electronic circuits thereof) may be compensated. In other embodiments, additionally or alternatively an offset may be corrected. Most of the blocks of FIG. 6 process an incoming signal that is composed of signals and noise delivered by previous blocks and adds its own noise contribution. The final result is composed based on different signal sources (reference source 60 and first to third sensor 62, 67 and 69) and different noise sources (for example thermal noise, flicker noise, shaped noise (e.g. noise shaped noise, i.e. noise generated/subjected to noise shaping) of a sigma-delta analog-to-digital converter, uniform white noise of an SAR analog-to-digital converter), which are combined in a predetermined manner based on the arrangement and implementation details of the blocks shown in FIG. 6.

Figure 7:
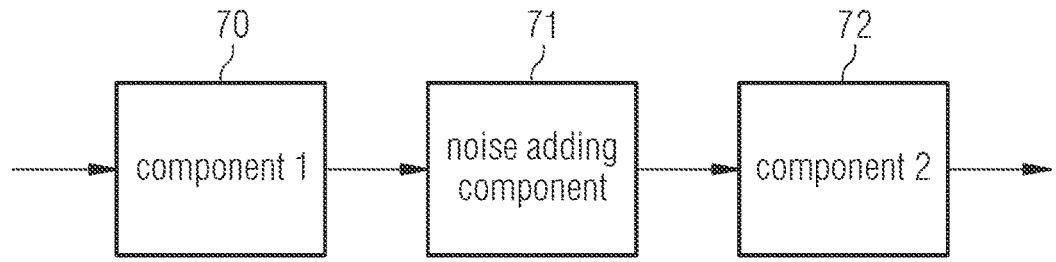
FIG. 7 is a diagram illustrating a modification of the embodiment of FIG. 6.

It should be noted that in some embodiments dedicated noise adding blocks may be additionally provided to add characteristic noise (for example for authenticity measurements). This is schematically illustrated in FIG. 7. Components 70 and 72 in FIG. 7 may be any blocks of a sensor device or system, for example any of the blocks shown in FIG. 6. In FIG. 7, a noise adding block 71 is provided between components 70, 72, which adds noise to the signal, in some embodiments at least predominantly in a frequency region outside a frequency region used by a wanted signal component, but does not process the signal otherwise. In other embodiments, noise may be added by noise adding block also or only in the frequency range used by the wanted signal component. Such noise adding blocks like component 71 may in particular be used for authenticity measurements.

Figure 8:
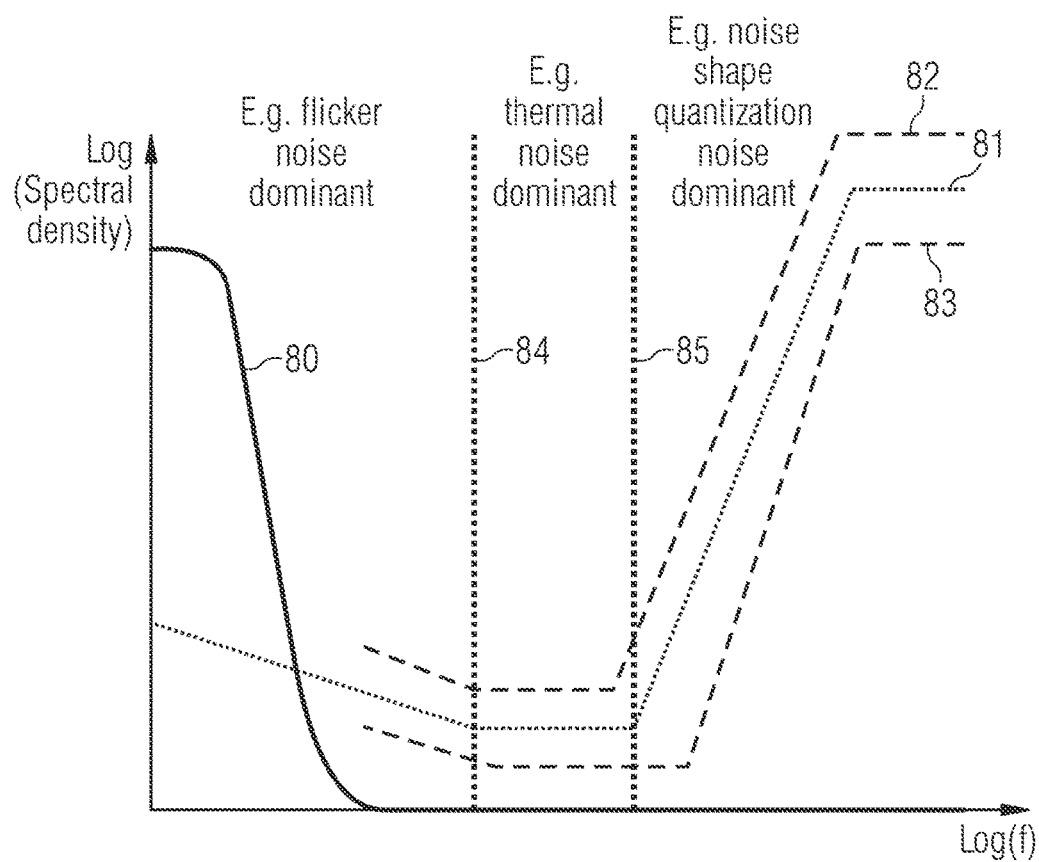
FIG. 8 is a diagram illustrating example signals for the embodiment of FIG. 6.

To illustrate noise analysis further, FIG. 8 illustrates a schematic output spectrum provided to block 66 of the embodiment of FIG. 6 (i.e. a spectrum of an example output signal of block 65). It should be noted that the signal shown in FIG. 8 serves only as an illustrative example, and depending on the implementation of various components of a sensor device or system the signal form may vary.

As an example, FIG. 8 illustrates a wanted signal component 80 (for example corresponding to a physical quantity measured by the sensor) and a noise signal component 81. FIG. 8 illustrates the spectral density versus frequency (f) in a log-log-plot. As illustrated in FIG. 8, the wanted signal component 80 is band-limited to lower frequencies.

In embodiments, the noise signal component 81 may be analyzed in a region above a frequency region of wanted signal component 80. In other embodiments, additionally or alternatively noise signal component 81 may be analyzed in the frequency region of wanted signal component 80. Furthermore, in cases where the frequency region of a wanted signal component does not start at 0, also a noise signal component in a frequency region below the frequency region of the wanted signal component may be analyzed. The wanted signal component may also be filtered out by a lowpass filter prior to noise analysis in some embodiments. In the example of FIG. 8, the noise component 81 may be divided into different regions, as illustrated by partitioning lines 84, 85. At frequencies below line 84, the noise component may be flicker noise dominant (1/f noise, shot noise). Such noise may for example be caused by electrons at a p-n junction and/or may be generated in an analog stage like block 63 of FIG. 6. At middle frequencies essentially between lines 84, 85 in FIG. 8, noise component 81 may be thermal noise dominant. Thermal noise may have a higher bandwidth than flicker noise. Finally, for frequencies higher than indicated by line 85, noise component 81 may be dominated by noise caused by a noise shaped quantization, for example by a sigma-delta analog-to-digital converter (ADC) like component 64 of FIG. 6. Noise in this region typically increases at a rate of the order of 20 dB per frequency decade for sigma-delta ADCs of second or third order.

In embodiments, the frequency spectrum of noise component 81 illustrated in FIG. 8 may be compared to upper and lower limits 82 and 83 in FIG. 8. When for some frequency or frequencies the noise component 81 leaves the "corridor" defined by limits 82 and 83, this may for example indicate a malfunction like a fault of the sensor signal and/or may indicate that another sensor device than intended by a manufacturer has been used, as each type of sensor device may have different typical noise characteristics. Depending on frequency range for which the noise signal component 81 leaves the "corridor" and depending on whether the upper limit 82 or the lower limit 83 of the corridor is violated, information regarding the type of malfunction and/or an indication which component of the sensor device may be malfunctioning may be obtained in some embodiments.

For example, as mentioned in the example of FIG. 8 for frequencies above line 85, the noise signal component is dominated by noise shaped quantization noise caused for example by a sigma-delta analog-to-digital converter. Therefore, a violation of the corridor in this frequency range may indicate some malfunctioning of a sigma-delta analog-to-digital converter of the sensor device.

Upper limit 82 and lower limit 83 represent threshold values for the noise, which may for example be determined by a calibration procedure, for example by measuring the noise of the sensor device under various operating conditions and/or for a plurality of sensor devices of a specific type, and selecting the upper and lower boundaries 82, 83 such that the noise signal component 81 is within the boundaries for such a fault-free use.

To give further examples regarding the analysis of noise signal component 81, when noise signal component 81 exceeds upper limit 82, this may indicate an instability of a sigma-delta analog-to-digital converter (like block 64), in particular when the exceeding occurs in the frequency range above line 85. An exceeding of the upper limit may also indicate any other (unwanted) oscillation for example of a reference voltage source (for example block 60 of FIG. 6), an external distortion for example through excessive noise on a supply voltage, an excess of a differential nonlinearity (DNL) limit of a Nyquist analog-to-digital converter, an over temperature, a malfunction of a temperature or stress sensor (for example sensors 67, 69 of FIG. 6), an increased radiation influence (for example alpha particles may increase a flicker noise contribution in a frequency range below line 84), a too high gain of internal transfer function blocks, nonlinear effects that transfer noise energy from one frequency to another frequency, or an increased defect density (for example traps in gate oxides used in the components may increase a contribution of flicker noise, i.e. in particular noise below line 84).

Excess of the lower limit 83 (i.e. noise signal component 81 falling below lower limit 83) may indicate e.g. stuck at faults of internal signals of the sensor device (which lead to reduction or complete absence of noise). Internal signals may refer to signals on electrical connections or at nodes in a circuit, e.g. an integrated circuit. As an example, a short circuit to ground may cause a node to be stuck at ground potential (which e.g. may represent a logic 0), and at the same time may reduce noise. Excess of the lower limit 83 may also indicate a too low gain of internal transfer function blocks (for example too low gain of an amplifier in block 63), nonlinear effects that transfer noise energy from one frequency to another frequency, or decrease or loss of a sensor bias voltage (for example output voltages of blocks 61, 68 of FIG. 6).

As can be seen from the above list of possible malfunctions which may cause a noise deviation, monitoring and analyzing the noise signal components has a high capability of detecting a malfunction of a sensor device, while the implementation effort of such an analysis is comparatively low. In embodiments, the failure reaction time required is long enough (for example in a millisecond range) to perform the required analysis of the noise (for example Fourier transform and comparing frequency components to upper and lower limits as explained above with reference to FIG. 8, or performing corresponding bandpass filtering).

Such a requirement regarding failure reaction time is often fulfilled for sensors which deliver band-limited signals (as illustrated in FIG. 8 for wanted signal component 80), for example airbags sensors, steering torque sensors, steering angle sensors, throttle valve sensors, manifold air pressure sensors or barometric air pressure sensors in automotive environments.

Dedicated noise adding components like components 71 may also add specific noise signatures to the noise signal component. For example by monitoring such dedicated noise signal components, the authenticity of the sensor device may be confirmed. Furthermore, also such dedicated noise signal components may have a specific reaction to environmental factors like over temperature, which may also be detected by monitoring the specific noise signature of the dedicated noise adding component.

In the embodiment illustrated with respect to FIG. 8, upper and lower limits 82, 83 are fixed. In other embodiments, such upper and lower limits may be variable and may depend on certain measured parameters, for example environmental parameters like temperature or stress. A corresponding embodiment will now be described with reference to FIGS. 9 and 10.

Figure 9:
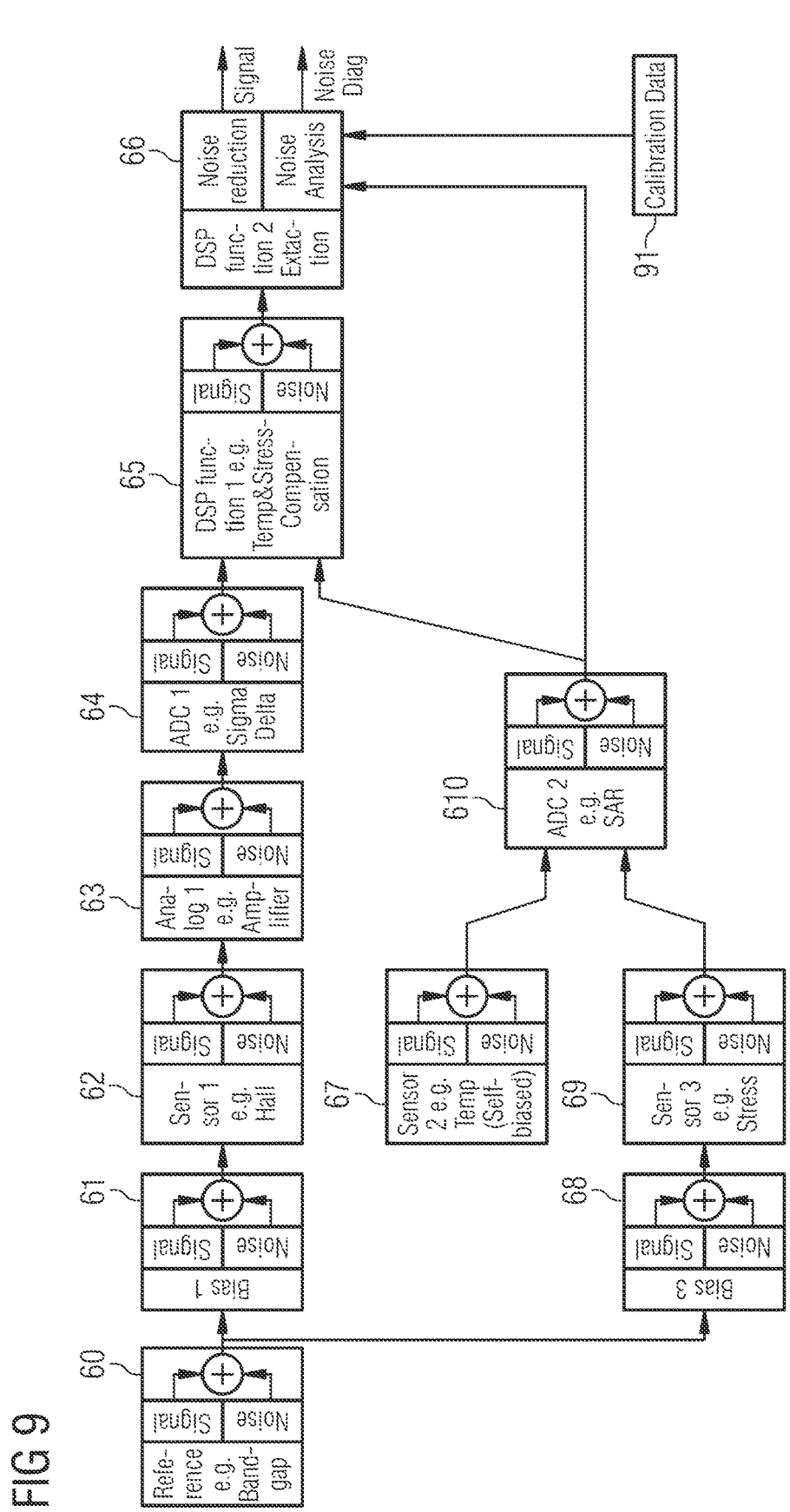
FIG. 9 is a detailed block diagram illustrating a device or system according to an embodiment.

FIG. 9 is a detailed block diagram of a sensor device or system according to a further embodiment. To avoid repetitions, blocks which have the same function as blocks in the embodiment of FIG. 6 bear the same reference numerals and will not be described again. Modifications and variations described with respect to the embodiment of FIG. 6 may also be applicable to the embodiment of FIG. 9.

In particular, FIG. 9 also shows a sensor device or system comprising a first sensor 62, which may be a magnetic field sensor like a Hall sensor, and second and third sensors 67, 69, which may measure temperature and stress, respectively.

Instead of block 66 of FIG. 6, in FIG. 9 a block 90 is provided which, similar to block 66 of FIG. 6, may be implemented using a digital signal processor and which may perform noise reduction on a signal received from block 65 and in addition may perform a noise analysis to provide information about the sensor device, for example information regarding possible malfunctions or information regarding authenticity, e.g. with respect to components upstream of block 90.

For noise analysis, block 90 in the embodiment of FIG. 9 may use variable limits or threshold values, for example variable upper and lower limits. These upper and lower limits may for example depend on a temperature measured by first sensor 67 and/or on a stress measured by third sensor 69. The noise analysis in block 90 may then use these limits for an adapted noise analysis. Such limits may e.g. be stored as calibration data in a storage 91. Storage 91 may for example be any kind of memory, for example a flash memory or a read-only memory or an electrically programmable read-only memory (EPROM), but is not limited thereto. Such calibration data may for example be obtained by measuring noise for a plurality of sensor devices under different conditions of parameters like temperature and/or stress. From such measurements one may obtain limits such that under normal (fault-free) operation these limits are not violated. It should be noted that temperature and stress are only given as examples of parameters which are measured and based on which limits are adjusted, and other parameters may also be used.

Figure 10:
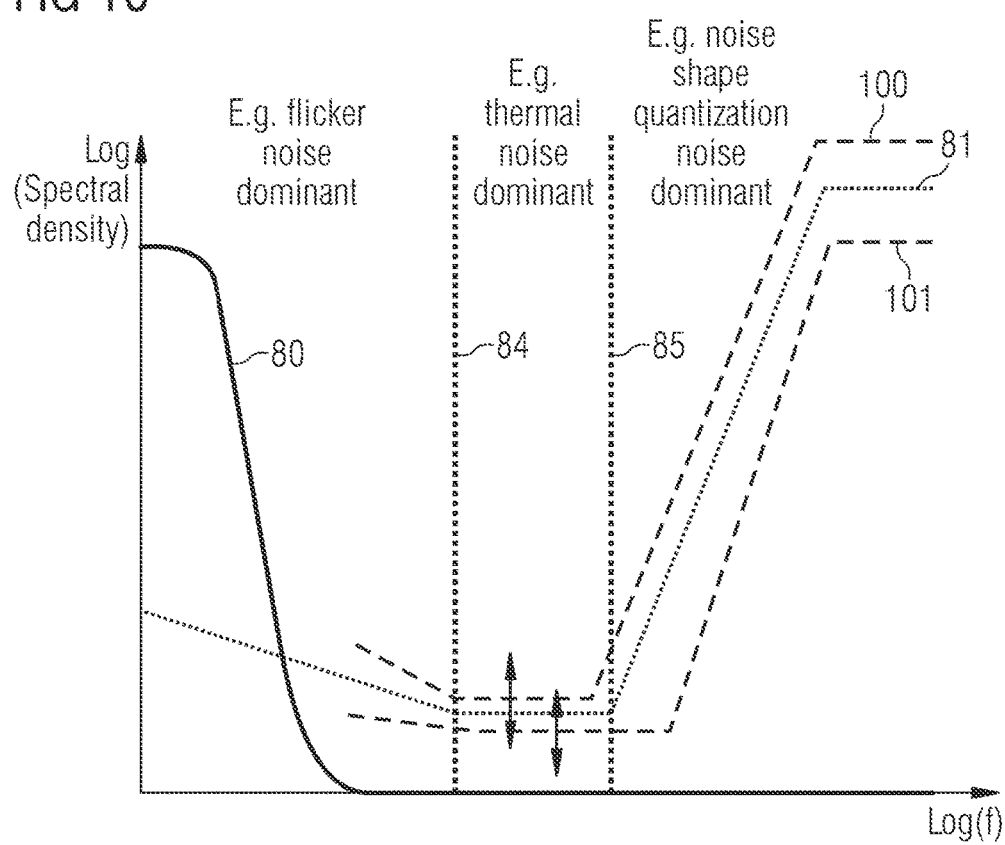
FIG. 10 is a diagram illustrating example signals for the embodiment of FIG. 9.

FIG. 10 illustrates such varying boundaries using the same wanted signal component 80 and same noise signal component 81 as in FIG. 8 as example signals. Reference numerals 84 and 85 illustrate boundaries between various noise regions, as has been explained with reference to FIG. 8. In contrast to FIG. 8, in FIG. 10 an upper limit 100 and a lower limit 101 are used which may be shifted depending e.g. on temperature. For example, upper limit 100 and lower limit 101 may be shifted upward with rising temperature and downward with falling temperature, reflecting the fact that in many applications noise increases with temperature. For example, thermal noise may be proportional to temperature.

With such an embodiment, for a given temperature the corridor between upper limit and lower limit may be made narrower as can be seen from a comparison between FIGS. 8 and 10. It should be noted that this need not apply for the whole frequency range, but may in some embodiments only be performed in a temperature range where thermal noise is dominant, for example essentially between lines 84 and 85. In other words, not the complete curves for upper limit 100 and lower limit 101 need to be shifted with temperature, but some parts may also remain essentially constant.

The corridor in particular may be made smaller compared to the corridor of FIG. 8. For example, the corridor defined by the upper and lower limits of FIG. 10 needs not be able to accommodate noise variations over a complete acceptable temperature range (for example temperature range for which the device is designed), but the corridor itself may shift with temperature, as indicated by arrows 102, 103. A smaller corridor means that malfunctions indicated by noise may be detected earlier and/or smaller deviations may be detected. In other words, the diagnostic coverage may be increased without decrease of availability of the sensor signal. To explain, with a smaller corridor malfunctions may be detected earlier as mentioned above, but also (e.g. if the corridor becomes too small) a risk that correct values are interpreted as indicating a malfunction increases. Without e.g. shifting the corridor with temperature, the corridor has to be wide enough to accommodate correct values for all relevant temperatures. With the shifting explained above, the corridor may be made smaller without essentially increasing the risk that correct values are interpreted as errors, as the corridor now has to accommodate only correct values for a specific temperature or temperature sub-range.

It should be noted that the upper and lower limits may not only be changed depending on external parameters, but may also be changed or adapted based on other criteria in some embodiments. For example, the corridor defined by upper and lower limit may be changed depending on internal states, for example narrowed after a defined settling time of the sensor device (for example a defined time after switching on the sensor device). In other words, the adaptation of the upper and lower limits may serve to adapt the upper and lower limits to changes of the noise behavior which are known and not indicative of malfunctions or other properties of the sensor device to be detected.

Besides the spectrum of the noise (i.e. spectral density over frequency), in some embodiments additionally or alternatively a statistical distribution of noise may be analyzed. For example, a thermal noise distribution usually has a Gaussian distribution, a flicker noise distribution has a Poisson distribution, and a quantization noise has a uniform distribution. Therefore, typical spectral distributions for noise in certain spectral regions can be predicted depending on the dominant noise sources in the respective region. Furthermore a statistic (of the amplitude distribution of the noise) can be obtained and compared to a predicted or expected distribution under normal operation conditions. Deviations from this expected distribution may again for example indicate a malfunction or a non-authenticated type of sensor device.

A corresponding embodiment using such distributions will now be explained with reference to FIGS. 11 and 12.

Figure 11:
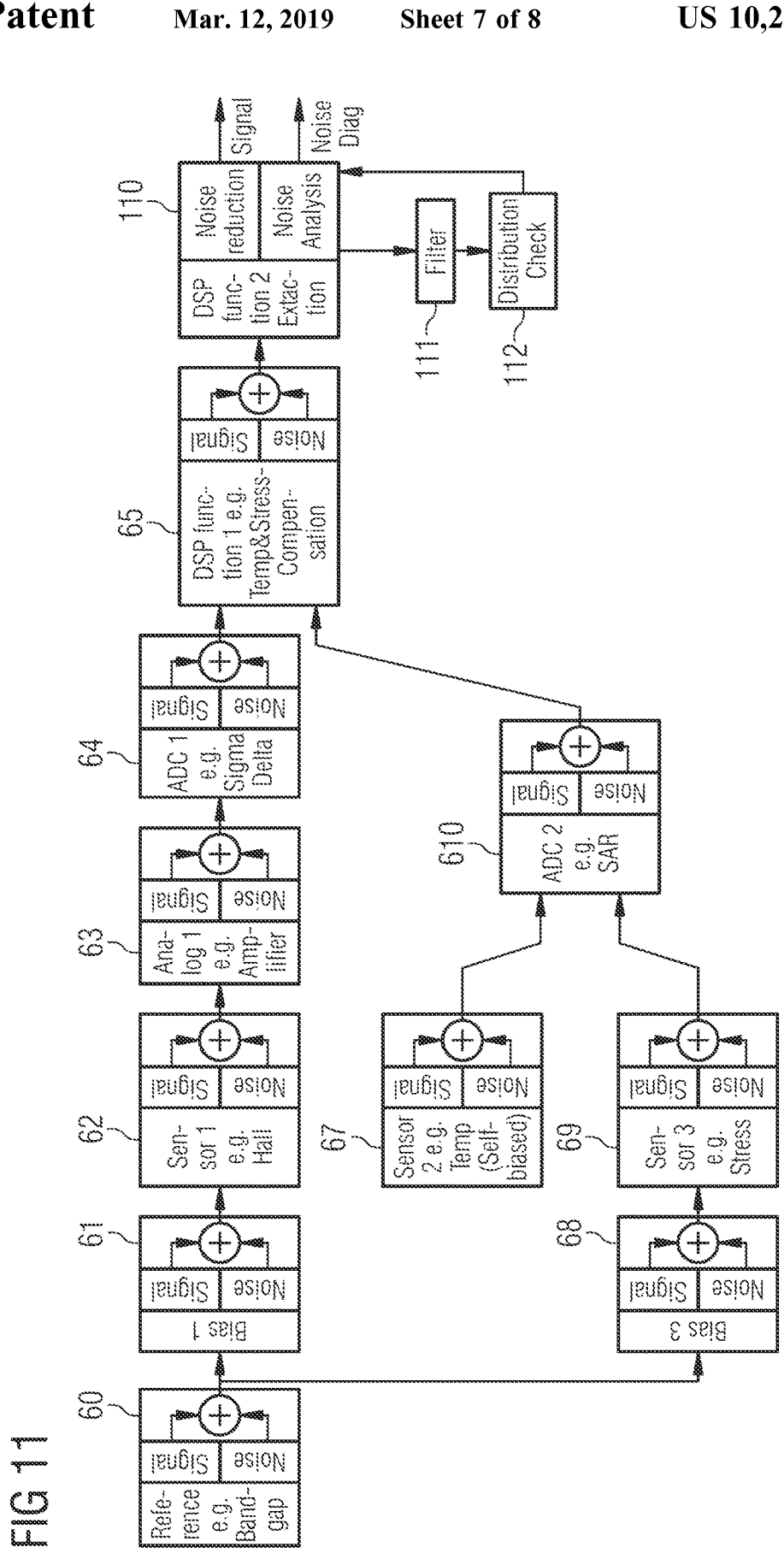
FIG. 11 is a detailed block diagram showing a device or system according to a further embodiment.

FIG. 11 is a detailed block diagram of a sensor device or system according to an embodiment, similar to the representation of FIG. 6. Blocks of FIG. 11 corresponding to blocks of FIG. 6 bear the same reference numerals and will not be described again. Modifications and variations described with respect to FIG. 6 may also be applicable to the embodiment of FIG. 11. Compared to FIG. 6, in the embodiment of FIG. 11 block 66 is replaced by block 110. Block 110 similar to block 66 may perform a noise reduction on a signal output by block 65 and may be implemented using a digital signal processor. Furthermore, block 110 performs a noise analysis to obtain information about the sensor device, for example information regarding a malfunction of the sensor device or information regarding authenticity of the sensor device.

The noise analysis of the embodiment of FIG. 11 uses a filter 111 and a distribution check 112 to check if a noise distribution corresponds to an expected distribution. For example, filter 111 may comprise a bandpass filter to filter out a frequency range to be analyzed, and distribution check 112 may then compare the distribution of the filtered signal to an expected distribution. It should be noted that while filter 111 and distribution check 112 are depicted as separate blocks in FIG. 11, they may be implemented using the same digital signal processor as block 110. In other embodiments, an additional digital signal processor or any other kind of hardware (for example logic or application-specific integrated circuit), firmware, software or combinations thereof may be used.

Figure 12:
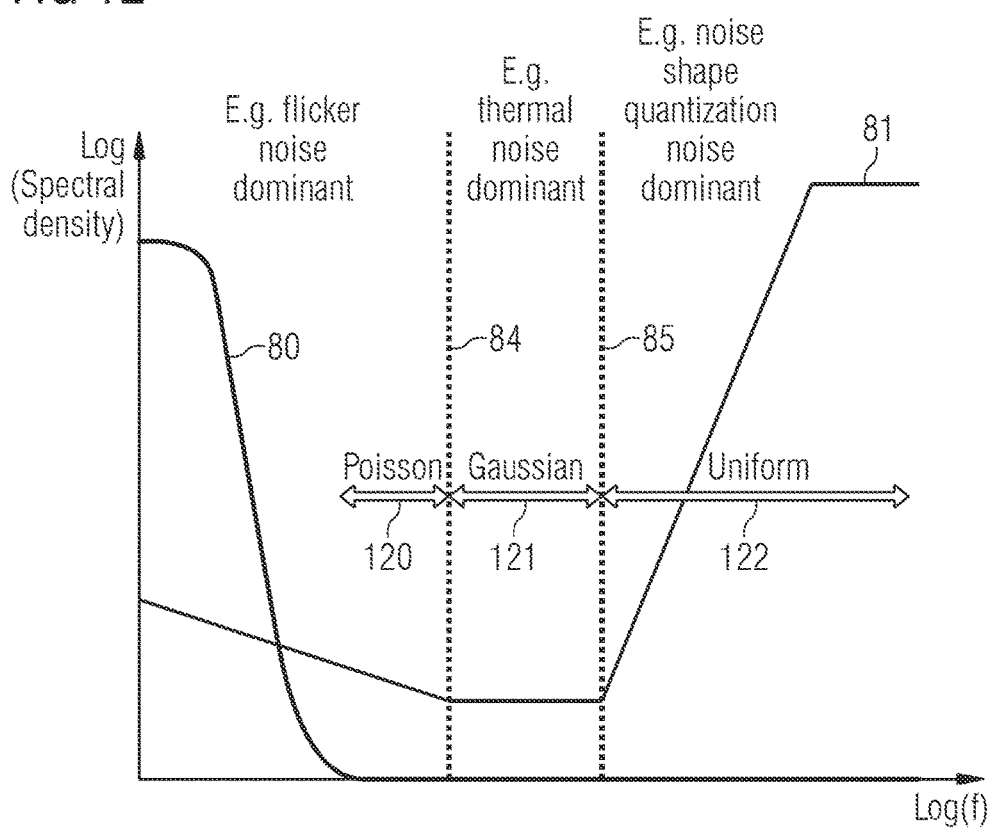
FIG. 12 is a diagram illustrating example signals for the embodiment of FIG. 11.

This approach of FIG. 11 will be further illustrated with respect to FIG. 12 using the same wanted signal component 80 and noise signal component 81 as in FIGS. 8 and 10 as an example. In FIG. 12, arrows 120, 121 and 122 show three different regions which have an expected distribution in the example of FIG. 12. Each region of FIG. 12 may be isolated by filtering out the remaining regions using for example a bandpass filter and then analyzing the distribution, as explained with reference to FIG. 11. In the example of FIG. 12, region 120 flicker noise is dominant and is expected to have a Poisson distribution. Region 121 is thermal noise dominated and is expected to have a Gaussian distribution, and region 122 is quantization noise dominant and is expected to have a uniform distribution. However, depending on an implementation of a sensor device other distributions may apply.

Besides comparing an actual noise distribution to an expected distribution as mentioned above, noise distributions may also be analyzed in other manners. For example, a noise distribution in a frequency range may be monitored over time (e.g. at regular or irregular intervals), and e.g. changes in the noise distribution exceeding a threshold may indicate a malfunction. For example, when a distribution suddenly becomes significantly smaller or significantly broader, this may indicate a malfunction. To detect changes, for example ratios of distributions at different points in time and/or differences between distributions may be calculated. For analyzing distributions, parameters describing the distributions may be extracted. Examples for such parameters include parameters of a function describing the distribution (for example of a Gauss function for a Gaussian distribution), or parameters like full width of the distribution at half the maximum value (FWHM). The above-mentioned possibilities for analysis may then be performed on the parameters (e.g. comparing parameters to expected values or forming ratios or differences between parameters of distributions at different points in time).

In other embodiments, other kinds of noise analysis may be performed. For example, a ratio of noise components (e.g. amplitudes, intensities etc.) in different frequency regions (for example the regions discussed with reference to FIG. 12 or subregions thereof) may be formed, and such noise ratios may be compared with upper and lower limits, and when exceeding the limits this may indicate a malfunction. Also, as mentioned with respect to FIG. 4, ratios of noise signal components of different sensor paths may be formed and also compared to limits. In some embodiments, also noise distributions over given frequency regions may be compared, for example by evaluating a ratio of the distributions, or distributions in the same frequency range at different points in time as mentioned above. For example, depending on the application a same type of distribution in two regions or a different type of distribution in two regions may indicate a malfunction.

Additional embodiments are provided below.

1. A device includes an evaluation circuit, wherein the evaluation circuit is configured to receive a sensor signal comprising a noise signal component, and wherein the evaluation circuit is further configured to evaluate the noise signal component to obtain information about a sensor device generating the sensor signal.

2. The device of embodiment 1, wherein the evaluation circuit comprises a digital signal processor.

3. The device of embodiment 1 or 2, wherein the device is comprised in an electronic control unit.

4. The device of embodiment 1 or 2, wherein the device is comprised in the sensor device.

5. The device of any one of embodiments 1 to 4, wherein the information comprises an authenticity information indicating if the sensor device is an expected type of sensor device.

6. The device of any one of embodiments 1 to 5, wherein the information comprises an information regarding a possible malfunction of the sensor device.

7. The device of embodiment 6, wherein the information comprises information regarding which component of the sensor device may have a malfunction.

8. The device of embodiment 6 or 7, wherein the information comprises an information regarding a type of malfunction.

9. The device of any one of embodiments 1 to 8, wherein analyzing the noise comprises analyzing the noise signal component in the frequency domain.

10. The device of any one of embodiments 1 to 9, wherein analyzing the noise comprises at least one of performing a Fourier transformation or a filtering to determine frequency components of the noise signal component.

11. The device of any one of embodiments 1 to 10, wherein the analyzing comprises analyzing the noise signal component in a frequency range essentially not occupied by a wanted signal component of the sensor signal.

12. The device of any one of embodiments 1 to 11, wherein analyzing the noise signal component comprises comparing the noise signal component to at least one limit.

13. The device of embodiment 12, wherein the at least one limit is variable depending on at least one parameter.

14. The device of embodiment 13, wherein the parameter comprises at least one of a temperature, a stress or an internal state.

15. The device of any one of embodiments 1 to 14, wherein analyzing the noise signal component comprises analyzing a distribution of the noise signal component in at least one predetermined frequency range.

16. The device of embodiment 15, wherein analyzing the distribution of the noise signal component comprises comparing the distribution in a predetermined frequency range to an expected distribution over the predetermined frequency range.

17. The device of any one of embodiments 1 to 16, wherein analyzing the noise signal component comprises forming a ratio of noise signal components in two different frequency ranges.

18. The device of any one of embodiments 1 to 17, wherein analyzing the noise signal component comprises forming a ratio of two noise signal components, the noise signal components being derived from two different sensor paths.

19. A system includes a sensor device, a device of any one of embodiments 1 to 17, and a connection between the sensor device and the device.

20. The system of embodiment 19, wherein the connection comprises a wire-based connection suitable for transmission of noise in frequencies outside a wanted signal component frequency.

21. A sensor device includes a sensor and at least one further component configured to add noise to the sensor signal without other processing of the sensor signal.

22. A method including receiving a sensor signal that includes a noise signal component, and analyzing the noise signal component to obtain information about a sensor device generating the sensor signal.

23. The method of embodiment 22, wherein the information comprises information regarding which component of the sensor device may have a malfunction and/or information regarding a type of malfunction.

24. The method of embodiment 22 or 23, wherein analyzing the noise signal component comprises comparing the noise signal component to at least one limit, wherein the at least one limit is variable depending on at least one parameter.

25. The method of any one of embodiments 22 to 24, wherein analyzing the noise signal component comprises comparing a distribution of the noise signal component in a predetermined frequency range to an expected distribution.

26. The method of any one of embodiments 22 to 25, wherein analyzing the noise signal component comprises forming a ratio of noise signal components in two different frequency ranges.

27. The method of any one of embodiments 22 to 26, wherein analyzing the noise signal component comprises forming a ratio between noise intensities of at least two different sensor paths.

28. The method of any one of embodiments 22 to 27, wherein analyzing the noise signal component comprises comparing noise distributions of noise signal components.

It should also be noted that embodiments need not be limited to one of the noise evaluation possibilities discussed above, but may also implement two or more of such possibilities. Therefore, the embodiments described above are to be seen as examples only and are not to be construed as limiting.

What is claimed is:

1. A device comprising:
an evaluation circuit, wherein the evaluation circuit is configured to receive a sensor signal generated by a sensor device and comprising a physical quantity measurement signal component and a noise signal component, the noise signal component being added by at least one component of the sensor device independently of the physical quantity measurement signal component, and
wherein the evaluation circuit is further configured to evaluate the noise signal component in a first frequency range outside a second frequency range of the physical quantity measurement signal component in order to derive information about the sensor device.

2. The device of claim 1, wherein the evaluation circuit comprises a digital signal processor.

3. The device of claim 1, wherein the device is comprised in an electronic control unit.

4. The device of claim 1, wherein the device is comprised in the sensor device.

5. The device of claim 1, wherein the information derived from the evaluated noise signal component comprises an authenticity information indicating whether the sensor device is an expected type of sensor device.

6. The device of claim 1, wherein the information derived from the evaluated noise signal component comprises information regarding a possible malfunction of the sensor device.

7. The device of claim 6, wherein the information derived from the evaluated noise signal component comprises information regarding which component of a plurality of components of the sensor device has the possible malfunction.

8. The device of claim 6, wherein the information derived from the evaluated noise signal component comprises information regarding a type of malfunction.

9. The device of claim 1, wherein the evaluation circuit is further configured to evaluate the noise signal component in a frequency domain.

10. The device of claim 9, wherein the evaluation circuit is further configured to evaluate the noise signal component by performing at least one of a Fourier transformation or a filtering to determine frequency components of the noise signal component, each of the determined frequency components comprising a different frequency range of the noise signal component, and the evaluation circuit is further configured to evaluate a spectral density of each determined frequency component and derive information about the sensor device for each determined frequency component based on the evaluated spectral density of a corresponding frequency component.

11. The device of claim 1, wherein the evaluation circuit is further configured to evaluate the noise signal component by comparing the noise signal component to at least one limit.

12. The device of claim 11, wherein the at least one limit is variable over a frequency range of the noise signal component depending on at least one parameter, wherein the parameter comprises at least one of a temperature, a stress or an internal state.

13. The device of claim 1, wherein the evaluation circuit is further configured to evaluate the noise signal component by analyzing a distribution of the noise signal component in at least one predetermined frequency range.

14. The device of claim 13, wherein analyzing the distribution of the noise signal component comprises comparing the distribution in a predetermined frequency range to an expected distribution over the predetermined frequency range.

15. The device of claim 1, wherein the evaluation circuit is further configured to evaluate the noise signal component by calculating a ratio of noise signal components in two different frequency ranges, and evaluating the calculated ratio to derive the information.

16. The device of claim 1, wherein the evaluation circuit is further configured to evaluate the noise signal component by calculating a ratio of two noise signal components, the noise signal components being derived from two different sensor paths, and evaluating the calculated ratio to derive the information.

17. A system, comprising:
a sensor device;
an evaluation circuit, wherein the evaluation circuit is configured to receive a sensor signal generated by a sensor device and comprising a physical quantity measurement signal component and a noise signal component, the noise signal component being added by at least one component of the sensor device independently of the physical quantity measurement signal component, and the evaluation circuit is further configured to evaluate the noise signal component in a first frequency range outside a second frequency range of the physical quantity measurement signal component in order to derive information about the sensor device; and
a connection between the sensor device and the evaluation device.

18. The system of claim 17, wherein the connection comprises a wire-based connection suitable for transmission of noise in frequencies outside the second frequency range of the physical quantity measurement signal component.

19. The device of claim 1, wherein the evaluation circuit is configured to evaluate a first frequency component of the noise signal component and a second frequency component of the noise signal component that is different from the first frequency component, and obtain the information based on the evaluated first frequency component and the evaluated second frequency component.

20. The device of claim 19, wherein:
the evaluation circuit is configured to compare a first frequency spectrum of the first frequency component to a first pair of thresholds that define a first corridor, and determine that a first deviation is present at the sensor device on a condition that the first frequency spectrum of the first frequency component is outside the first corridor, and
the evaluation circuit is configured to compare a second frequency spectrum of the second frequency component to a second pair of thresholds that define a second corridor, and determine that a second deviation is present at the sensor device on a condition that the second frequency spectrum of the second frequency component is outside the second corridor.

21. The device of claim 1, wherein the evaluation circuit is configured to compare a frequency spectrum of the noise signal component to at least one threshold, and determine that a deviation is present at the sensor device on a condition that the frequency spectrum of the noise signal component is outside a corridor defined by the at least one threshold.

22. The device of claim 21, wherein the at least one threshold includes an upper threshold and a lower threshold.

23. The device of claim 1, wherein the evaluation circuit is configured to compare a frequency spectrum of the noise signal component to at least one threshold, and determine a deviation is present in the sensor device on a condition that the frequency spectrum of the noise signal component exceeds the at least one threshold.

24. The system of claim 17, wherein the information derived from the evaluated noise signal component comprises an authenticity information indicating whether the sensor device is an expected type of sensor device.

25. The system of claim 17, wherein the information derived from the evaluated noise signal component comprises information regarding a possible malfunction of the sensor device.

26. The system of claim 17, wherein the evaluation circuit is further configured to evaluate the noise signal component by performing at least one of a Fourier transformation or a filtering to determine frequency components of the noise signal component, each of the determined frequency components comprising a different frequency range of the noise signal component, and the evaluation circuit is further configured to evaluate a spectral density of each determined frequency component and derive information about the sensor device for each determined frequency component based on the evaluated spectral density of a corresponding frequency component.

27. The system of claim 17, wherein the evaluation circuit is further configured to evaluate the noise signal component by comparing the noise signal component to at least one limit, and wherein the at least one limit is variable over a frequency range of the noise signal component depending on at least one parameter, wherein the parameter comprises at least one of a temperature, a stress, or an internal state.

28. The system of claim 17, wherein the evaluation circuit is further configured to evaluate the noise signal component by calculating a ratio of noise signal components in two different frequency ranges, and evaluating the calculated ratio to derive the information.

\* \* \* \* \*